United States Patent [19]

Duttweiler

[11] 4,243,959
[45] Jan. 6, 1981

[54] ADAPTIVE FILTER WITH TAP COEFFICIENT LEAKAGE

[75] Inventor: Donald L. Duttweiler, Rumson, N.J.

[73] Assignee: Bell Telephone Laboratories, Incorporated, Murray Hill, N.J.

[21] Appl. No.: 50,890

[22] Filed: Jun. 21, 1979

[51] Int. Cl.³ .................. H03A 15/00; H03A 17/00
[52] U.S. Cl. .................................. 333/166; 333/18
[58] Field of Search .............. 179/170.2; 333/166, 333/173, 18

[56] References Cited

U.S. PATENT DOCUMENTS

| | | | |
|---|---|---|---|
| 3,499,999 | 3/1970 | Sondhi | 179/170.2 |
| 3,500,000 | 3/1970 | Kelly et al. | 179/170.2 |
| 4,129,753 | 12/1978 | Duttweiler | 179/170.2 |

OTHER PUBLICATIONS

Peatman, The Design of Digital Systems, McGraw-Hill Book Co., (1972), pp. 23–26.
Helder et al., Improving Transmission on Domestic Satellite Circuits, Bell Lab. Record, Sep. 1977, pp. 202–207.
Duttweiler, IEEE Transactions on Communications, vol. COM-26, No. 5, May 1978, pp. 647–653.

*Primary Examiner*—Eli Lieberman
*Attorney, Agent, or Firm*—Richard J. Roddy

[57] ABSTRACT

Adaptive filters are commonly used in echo cancelers and automatic equalizers. Usually adaptive filters include a tapped delay line and apparatus coupled to the delay line for producing a tap coefficient signal, whose sign and magnitude indicate the appropriate correction in adjusting the filter. However, in the presence of input signals having a partial frequency band spectrum, known filters tend to become unstable, e.g., tap coefficient signals blow up. The instant arrangement includes apparatus for weakly driving the tap coefficient signals to optimal values. As illustrated in a deceptively simple embodiment, a tap coefficient updating component is extended through a one's complement converter to a first input of a binary adder. A two's complement output of the adder is fed back to a second input of the adder. The sign of the adder output is also provided to a CARRY-IN input terminal of the adder. Functionally, a unit leak is introduced in the least significant bit of the adder output tap coefficient signal whenever the updating component and the tap coefficient signal are of opposite algebraic signs. Otherwise, no leak is introduced. Thereby the tap coefficient signal is weakly driven toward zero.

4 Claims, 4 Drawing Figures

ADAPTIVE FILTER WITH TAP COEFFICIENT LEAKAGE

TECHNICAL FIELD

This invention relates to adaptive filters and, more particularly, to apparatus for controlling tap coefficient leakage in adaptive filters.

BACKGROUND OF THE INVENTION

Adaptive filter networks have found application in a wide variety of arrangements. For example, J. L. Kelly, Jr. and B. F. Logan in U.S. Pat. No. 3,500,000 issued Mar. 10, 1970 disclose an echo canceller employing estimator apparatus including an adaptive filter for synthesizing a linear approximation of the echo. Using a tapped delay line having an integer N taps spaced along its length at convenient Nyquist intervals, the filter develops a number of delayed replicas of the incoming signal. The delayed replicas are correlated, e.g., by multiplication with an error signal, and the resultant correlated signal is averaged, e.g., using an intergrator, to provide a tap coefficient signal whose polarity and magnitude indicate the appropriate adjustment for gain controlling networks. The gain controlled output signals are then algebraically combined to obtain the synthesized echo estimate for subtraction from the outgoing signal. Thereby, the echo is cancelled.

Another application for adaptive filter networks is in the automatic equalizer art. An automatic equalizer generally includes an adaptive transversal filter in which successive, i.e., delayed, samples of the incoming signal are multiplied by respective tap coefficients and the products summed to obtain an equalized signal. An error signal equal to the difference between the equalized signal and a reference signal is formed. The error signal is used to adjust the equalizer by updating the tap coefficients in such a way as to minimize signal distortion.

Unfortunately, biases in the tap coefficient providing apparatus, for example, updating biases associated with rounding signal values consistent with the precision of the apparatus being employed, can cause some tap coefficients to drift toward relatively large values in which event the coefficients are said to "blow up". To mitigate blow up, tap coefficient leakage of the type disclosed in a copending application of R. D. Gitlin et al Case 5-5-7, entitled "Coefficient Tap Leakage for Fractionally-Spaced Equalizers", Ser. No. 16,495, and filed Mar. 1, 1979 is introduced for driving some tap coefficients toward zero. Clearly, if all coefficients are driven to zero, the functional operativeness of the echo canceller or the automatic equalizer would be circumvented. Hence, tap coefficient leakage must not be too "strong".

SUMMARY OF THE INVENTION

This and other problems are mitigated in accordance with the principles of my invention by an improved adaptive filter for controlling the strength of the tap coefficient leakage. The filter includes an arrangement responsive to a coefficient updating component and to a tap coefficient for weakly driving the tap coefficient signal to an optimal value, e.g., toward zero, by intermittently introducing leakage. According to one aspect, leak is periodically introduced during one sample out of a predetermined number of sample periods. According to another aspect, shown in an illustrative embodiment, the filter includes tap coefficient providing apparatus for extending the updating component through a converter to a first input of a digital adder. An output of the adder is fed back to a second of its inputs while the output sign bit is provided to a third input. The adder output tap coefficient signal has a unit of leak introduced whenever the updating component and the tap coefficient signal are of opposite algebraic signs. Thereby the tap coefficient is weakly driven toward zero.

BRIEF DESCRIPTION OF THE DRAWING

My invention should become fully apparent when taken in connection with the following detailed description and the accompanying drawing in which.

DETAILED DESCRIPTION

Conventionally, adaptive filter tap coefficients are updated by arithmetically combining, e.g., adding or subtracting, a correction term. The updating procedure can be represented as $$H_i(k+1) = H_i(k) + F_i(k) \begin{cases} k = 0, 1, 2, \ldots \\ i = 1, 2, \ldots N \end{cases} \quad (1)$$

wherein $H_i(k)$ is the i-th tap coefficient; $F_i(k)$ is the correction term; k is the sample interval; and i is the integer identification of a tap in the tapped filter delay line. Hereinafter, for simplicity of expression, the subscript i is omitted, it being understood that $H(k)$ will, for example, represent $H_i(k)$.

Figure 1:
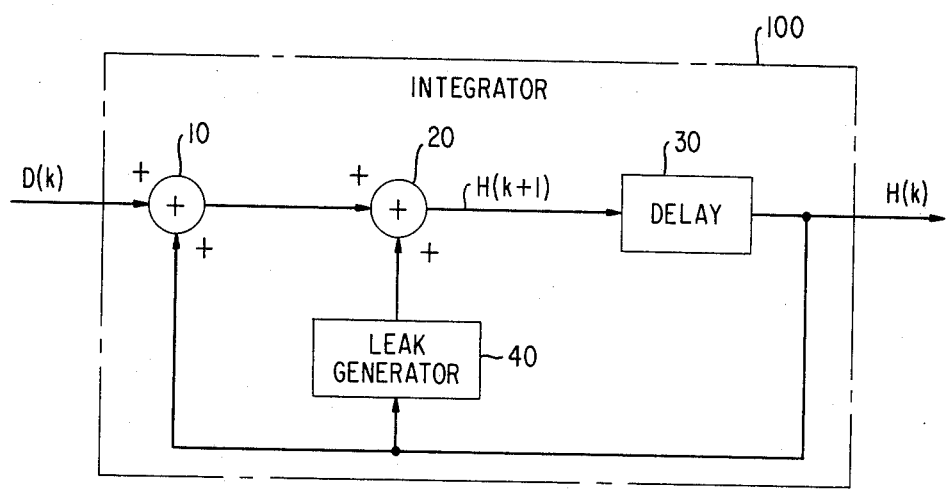
FIG. 1 illustrates in functional structure form prior art tap coefficient apparatus.

Usually, tap coefficient leakage is introduced in the coefficient updating procedure either by premultiplying $H(k)$ by a positive number having a value less than unity or by including a tap leakage component within correction term $F(k)$. The latter approach is used herein. Hence, correction term $F(k)$ comprises two components, i.e., an updating component and a tap leakage component. Although the magnitude of the tap leakage component may depend upon some tap coefficient value, in the present illustrative embodiment the tap leakage component is assumed to have a predetermined constant magnitude and, hence, be independent of any coefficient. Illustrative of an arrangement having a constant magnitude tap leakage component is that disclosed in the aforementioned copending application of R. D. Gitlin et al, which may be illustrated in the functional structure form shown in FIG. 1 with my suggested embodiment thereof being illustrated in FIG. 2. Turning to FIG. 1, a signal $D(k)$, for example, a correlated signal obtained, as in the prior art, by multiplying a delayed replica of a filter input signal with an error signal, is extended as the updating component to tap coefficient providing apparatus, here integrator 100, and therein to a first input of adder 10. A second adder 10 input is tap coefficient signal $H(k)$, which is fed back to adder 10 from an output of delay network 30. Thereby, the tap coefficient is updated. The updated coefficient output of adder 10 is extended to a first input of adder 20. A second adder 20 input is the tap leakage component extended from an output of leak generator 40. Thereby, leakage is introduced in the tap coefficient updating procedure. The updated, leak introduced tap coefficient for the next sampling interval H(k+1) is extended from an output of adder 20 to an input of delay network 30. The current coefficient H(k) is also fed back to an input of leak generator 40. As to illustrative leak generator 40, responsive to a positive coefficient H(k), generator 40 may extend a negative leak component to the second input of adder 20 and, conversely, responsive to a negative coefficient H(k), may extend a positive leak component to the second input of adder 20. With such a leak generator, the correction term F(k) is given as $$F(k) = D(k) + \alpha \text{sign}(H(k)) \qquad (2)$$

where D(k) is the updating component and the tap leakage component includes $\alpha$, which is a predetermined constant, and sign (H(k)), which is either +1 or −1, corresponding to the algebraic sign of H(k) being positive or negative, respectively. Assuming the predetermined constant $\alpha$ to equal −1, the effect of the FIG. 1 functional structure is the driving of the tap coefficient toward zero the driving occurring during each sample interval k. For example, a positive "nudge" toward zero is given for negative coefficients while a negative nudge toward zero is given for positive coefficients.

Figure 2:
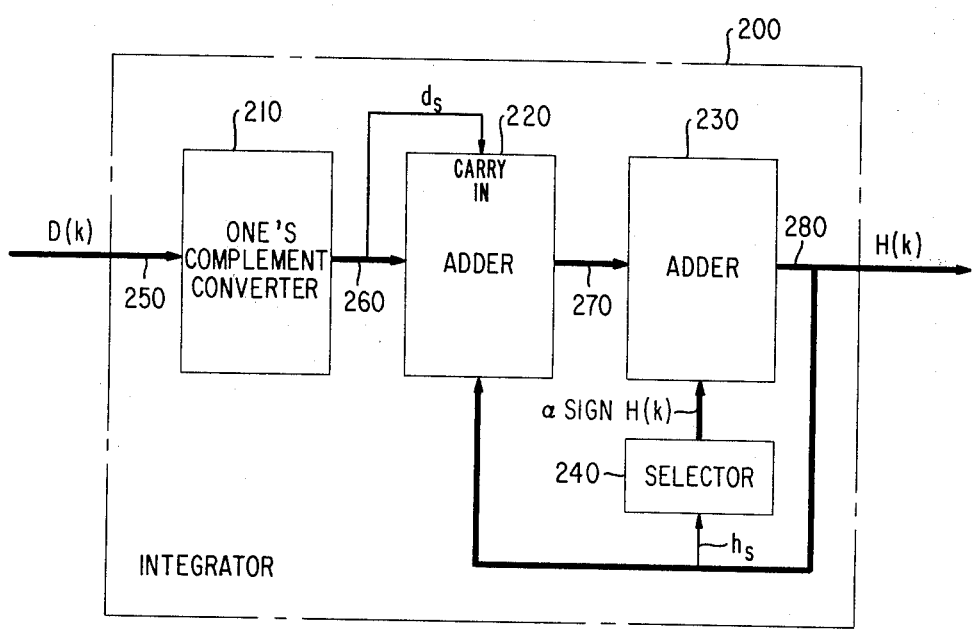
FIG. 2 illustrates my suggested embodiment of the FIG. 1 functional structure.

An embodiment of the above-described functional structure is illustrated in FIG. 2. As a prelude, the FIG. 2 embodiment uses commonly available digital apparatus including adders having a CARRY-IN input terminal to which may be supplied a single bit for addition to the least significant bit of the sum of the adder's first and second inputs. Also, updating component D(k) is assumed to be a number in sign plus binary magnitude form. That is, updating component D(k) includes a sign bit $d_s$ and one or more magnitude bits. The sign bit is assumed to be a logical zero for representing a positive number and a logical one for representing a negative number. In addition, the FIG. 2 embodiment uses fixed point arithmetic as well as one's and two's complement number form. For background, the binary representation of a positive number is identical in all three number forms, i.e., in sign plus binary magnitude form, in one's complement form, and in two's complement form. On the other hand, the binary representation for a negative number differs in each of the three number forms. In sign plus binary magnitude form, the sign bit is a logic one while the magnitude bits are a binary representation identical to that of a positive number of the same magnitude. In one's complement form, each magnitude bit of the sign plus binary magnitude form is complemented, i.e., logically inversed. In two's complement form, the magnitude bits are obtained by adding one to the least significant bit of the one's complement form. That is, the two's complement of a negative number is formed from its sign/magnitude representation by complementing each bit of the number (which forms the one's complement of the number) and adding one to the least significant bit. A direct result of the two's complement form is that such numbers may be added together without regard to their algebraic signs. The resultant sum is a correct two's complement form representation of the sum, provided any overflow is neglected. See, for example, John B. Peatman, "The Design of Digital Systems", (New York: McGraw-Hill Book Company, 1972) pp. 23-26.

Updating component D(k), which is assumed to be in sign plus binary magnitude form, is supplied in parallel over cable 250 to tap coefficient providing apparatus, here integrator 200, and therein to an input of one's complement converter 210. Thereafter, D(k) in one's complement form is extended from an output of converter 210 over cable 260 to a first input of adder 220. The two's complement form of updating term D(k) is obtained within adder 220 by extending sign bit $d_s$ of the CARRY-IN input of adder 220 and its one's complement form to the first input of adder 220. Tap coefficient H(k) in two's complement form is fed back from an output of adder 230 over cable 280 to the second input of adder 220 thereby obtaining on cable 270 the next tap coefficient before leak is introduced, i.e., $H_{without} = H(k) + D(k)$. Leak is introduced during each sample period of the FIG. 2 embodiment by way of selector 240, which, responsive to the sign bit $h_s$ of the present coefficient H(k), extends in two's complement notation an equation (2) leakage component, $\alpha$ sign (H(k)), here a −1 or a +1, responsive respectively to a positive or a negative sign bit $h_s$, to a second input of adder 230. An output of adder 230 is then tap coefficient H(k).

Figure 3:
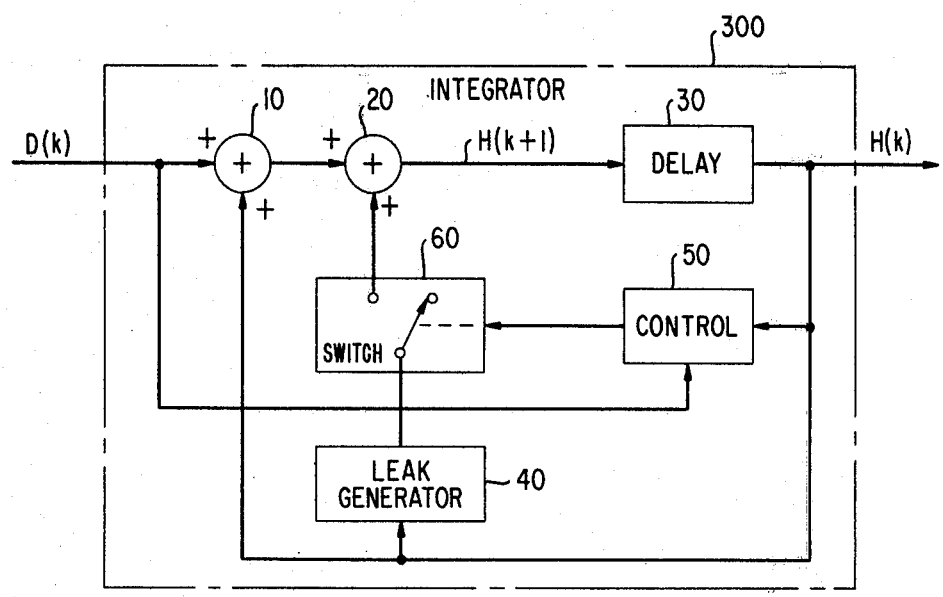
FIG. 3 illustrates in functional structure form tap coefficient apparatus in accord with the principles of my invention.

In accord with the principles of my invention, an improvement over the functional structure of FIG. 1 for controlling the strength of tap coefficient leakage in adaptive filters is illustrated in FIG. 3. Referring to FIG. 3, adders 10 and 20, delay network 30, and leak generator 40 parallel the functional structure illustrated in FIG. 1. Unlike that functional structure, my improvement includes control 50 and switch 60 for controlling the strength of the tap coefficient leakage. For example, according to one aspect of my invention, leak is introduced by intermittently closing switch 60 thereby intermittently connecting the output of leak generator 40 to the second input of adder 20, the switch being circuitwise interposed between the output of selector 240 and the second input of adder 230. Switch 60 is intermittently closed responsive to a control signal from control 50, for example, during a predetermined number of consecutive sample periods, say 64 periods, the switch may be periodically closed for one sample period and opened for the next 63 sample periods. And, inasmuch as adaptive filters tend to become unstable in the presence of input signals having a partial frequency band spectrum, my improvement weekly drives filter tap coefficients toward zero and thereby stabilizes the filter.

Figure 4:
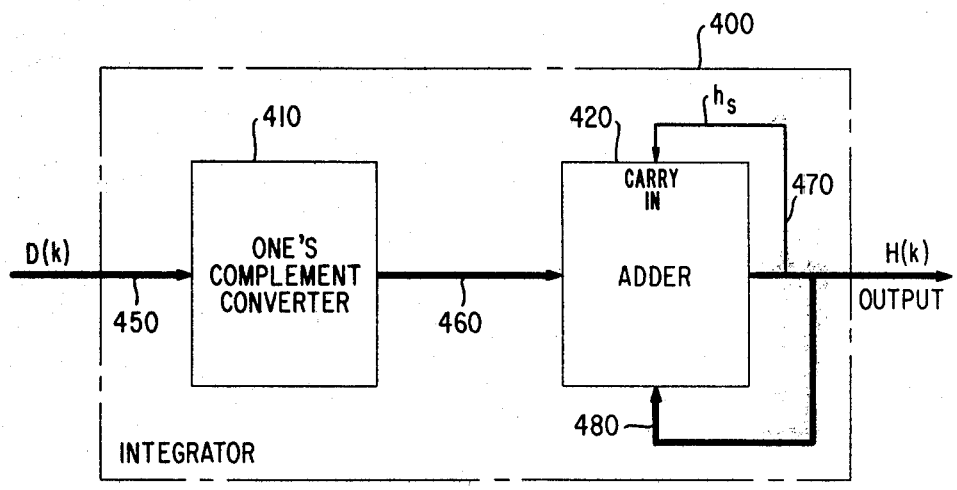
FIG. 4 is an illustrative embodiment of the functional structure form of FIG. 3.

Further, although the functional structure in FIG. 3 appears more complex than that illustrated in FIG. 1, an embodiment thereof, as shown in FIG. 4, advantageously includes less equipment than the FIG. 2 embodiment, to wit: one less adder and no selector. It was previously noted that the FIG. 1 functional structure introduces leak for each sample period. According to another aspect of my invention for controlling the strength of the tap coefficient leakage, my functional structure introduces leak only when the updating term D(k) and the tap coefficient H(k) are of opposite algebraic sign. Otherwise, no leak is introduced. Thereby my tap coefficient leakage apparatus further controls the strength of the leak.

Referring to FIG. 4, updating component D(k), extended in parallel format over cable 450 to tap coefficient providing apparatus, here integrator 400, is converted to one's complement form by converter 410 for extension over cable 460 to a first input of adder 420. A second input to adder 420 is its own output signal, tap coefficient H(k), which is supplied over cable 480 in two's complement form to the second input. Also, sign bit $h_s$ of tap coefficient H(k) is, as will soon become apparent, cleverly supplied to a CARRY-IN input of adder 420.

It will be recalled that the one's complement form of a positive number is identical to its two's complement form but that the one's complement form of a negative number is one less than its two's complement form. That principal is included in the following table, which is useful in explaining the operation of the FIG. 4 embodiment. It is noted that $H_{without} = H(k) + D(k)$, i.e., the tap coefficient without leak. It is worth repeating that, $H_{without}$ is identical to the signal output of adder 220 in FIG. 2.

| Row | D(k) | H(k) | $d_s$ | $h_s$ | Next Sample Output |
| --- | --- | --- | --- | --- | --- |
| (1) | >0 | >0 | 0 | 0 | H(k + 1) = $H_{without}$ |
| (2) | <0 | >0 | 1 | 0 | H(k + 1) = $H_{without} - 1$ |
| (3) | >0 | <0 | 0 | 1 | H(k + 1) = $H_{without} + 1$ |
| (4) | <0 | <0 | 1 | 1 | H(k + 1) = $H_{without}$ |

First, when updating term D(k) is negative, i.e., $d_s = 1$, and tap coefficient H(k) is positive, i.e., $h_s = 0$, as shown in row 2 of the above table, negative leak is introduced in the positive tap coefficient. Cleverly, this obtains because a one's complement form of D(k) is on cable 460 and the CARRY-IN signal $h_s = 0$. As mentioned, the one's complement form of a negative number is one less than its two's complement form. Hence, a unit of negative leak is introduced.

Second, when updating term D(k) is positive, i.e., $d_s = 0$, and tap coefficient H(k) is negative, i.e., $h_s = 1$, as shown in row 3, positive leak is introduced in the negative tap coefficient. This obtains in a deceptively simple manner. Since sign bit $h_s$ of tap coefficient H(k) is a binary one indicating a negative sign and since same is extended to the CARRY-IN input of 420, unity is added to the $H_{without}$ sum. Hence, a unit of positive leak is introduced.

Third and fourth, when updating term D(k) and tap coefficient H(k) are of like sign, as shown in rows 1 and 4, no leak is introduced, i.e., $H(k+1) = H_{without}$. This obtains, for positive D(k) and positive H(k), because the positive one's complement form of a number is identical to its two's complement form and the CARRY-IN sign bit $h_s$ is zero. This obtains, for negative D(k) and negative H(k), because D(k) is converted to two's complement form internal to adder 420 by adding the binary one, extended by way of sign bit $h_s$ to the CARRY-IN input, to the one's complement form of D(k) appearing on cable 460.

Fortuitously, and as is evidenced upon study of the above table, the strength of the leak is controlled by intermittently introducing leak in some sample periods rather than in each sample period. By thusly controlling the strength of the tap coefficient leakage, including in the presence of input signals having a partial frequency band spectrum, my improvement weakly drives the filter tap coefficients to an optimal value for stabilizing the filter. By weak, I mean a time constant measured in seconds. Also, inasmuch as H(k) may commonly be in the order of 13 to 16 bits, the addition or subtraction of a small tap leakage component to its least significant bit(s), unity as in my illustrative embodiment, weakly drives the filter coefficients toward zero.

I claim:

1. A digital adaptive filter including a tapped delay line and apparatus coupled to said delay line for providing a tap coefficient signal, said tap coefficient providing apparatus (100, 200, 300, 400) including leak apparatus (40, 240) for introducing leakage in said tap coefficient signal and CHARACTERIZED IN THAT said digital filter further comprises means (50, 60) for controlling the strength of said tap coefficient leakage, said controlling means including means for weakly driving said tap coefficient signal toward zero said driving means including means (410, 420) responsive to an updating component (450) of said tap coefficient and responsive to said tap coefficient (470, 480) for intermittently introducing leakage.

2. The digital filter defined in claim 1 wherein said driving means further comprises:
means (450, 451, 410) for extending said updating component to a first input of an adder (420);
means (480) for extending an output of said tap coefficient providing apparatus to a second input of said adder; and
means (470) for extending a sign of said tap coefficient signal to a third input of said adder
whereby leakage is introduced when the sign of said updating component and said tap coefficient signal are algebraically opposite.

3. A digital adaptive filter including apparatus (100, 200, 300, 400) for providing a tap coefficient signal, said providing apparatus including leakage apparatus (40, 240) for introducing leakage in said tap coefficient signal and CHARACTERIZED IN THAT said digital filter further comprises:
means (450, 410, 460, 420, 470, 480) responsive to an input updating signal and to a prior tap coefficient signal for controlling the strength of the tap coefficient leakage introduced into a subsequent tap coefficient signal, said controlling means including means for selectively introducing leakage whenever the updating component and the present coefficient signal are of opposite algebraic signs.

4. A digital adaptive filter including a tapped delay line and apparatus coupled to said delay line for introducing leakage in a tap coefficient signal and CHARACTERIZED IN THAT said digital filter further comprises
means (410, 410, 460) for converting an updating component from a first binary form to a second binary form;
means (480) for extending a prior tap coefficient signal in said second form to a second input of an adder (420);
means (460, 420, 470, 480) for introducing leakage when said updating component and said tap coefficient signal are of opposite algebraic signs, said leakage being negative responsive to a positive tap coefficient signal and said leakage being positive responsive to a negative tap coefficient signal.

* * * * *